(12) United States Patent
Nagai et al.

(10) Patent No.: US 7,999,241 B2
(45) Date of Patent: Aug. 16, 2011

(54) EXTREME ULTRAVIOLET LIGHT SOURCE APPARATUS

(75) Inventors: Shinji Nagai, Hiratsuka (JP); Takanobu Ishihara, Hiratsuka (JP); Kouji Kakizaki, Hiratsuka (JP); Tamotsu Abe, Odawara (JP)

(73) Assignee: Gigaphoton Inc., Tochigi (JP)

( * ) Notice: Subject to any disclaimer, the term of this patent is extended or adjusted under 35 U.S.C. 154(b) by 112 days.

(21) Appl. No.: 12/605,113

(22) Filed: Oct. 23, 2009

(65) Prior Publication Data
US 2010/0140513 A1 Jun. 10, 2010

(30) Foreign Application Priority Data

Oct. 23, 2008 (JP) ................................. 2008-273504
Oct. 21, 2009 (JP) ................................. 2009-242868

(51) Int. Cl.
*G21K 5/02* (2006.01)
*H01J 17/26* (2006.01)
(52) U.S. Cl. ................ 250/504 R; 250/423 R; 250/424; 250/489
(58) Field of Classification Search ............. 250/423 R, 250/424, 425, 461.1, 489, 504 R
See application file for complete search history.

(56) References Cited

U.S. PATENT DOCUMENTS

| | | | |
|---|---|---|---|
| 6,987,279 B2 | 1/2006 | Hoshino et al. | |
| 7,271,401 B2 * | 9/2007 | Imai et al. ................ | 250/504 R |
| 7,705,333 B2 * | 4/2010 | Komori et al. ............ | 250/504 R |
| 7,915,600 B2 * | 3/2011 | Ueno et al. ................ | 250/504 R |
| 2009/0224181 A1 * | 9/2009 | Abe et al. .................. | 250/504 R |
| 2009/0261277 A1 * | 10/2009 | Soumagne et al. ....... | 250/504 R |
| 2009/0272919 A1 * | 11/2009 | Abe et al. .................. | 250/504 R |
| 2010/0078579 A1 * | 4/2010 | Endo et al. ................ | 250/504 R |
| 2010/0090132 A1 * | 4/2010 | Endo et al. ................ | 250/504 R |
| 2010/0108918 A1 * | 5/2010 | Nagai et al. ............... | 250/504 R |
| 2010/0176312 A1 * | 7/2010 | Komori et al. ............ | 250/504 R |
| 2010/0181503 A1 * | 7/2010 | Yanagida et al. ......... | 250/504 R |
| 2010/0213395 A1 * | 8/2010 | Ueno et al. ................ | 250/504 R |
| 2010/0243922 A1 * | 9/2010 | Asayama et al. ......... | 250/504 R |

FOREIGN PATENT DOCUMENTS

| | | |
|---|---|---|
| JP | 2005-197456 | 7/2005 |
| JP | 2007-207574 | 8/2007 |

* cited by examiner

*Primary Examiner* — Bernard E Souw
(74) *Attorney, Agent, or Firm* — McDermott Will & Emery LLP

(57) ABSTRACT

An extreme ultraviolet light source apparatus has a magnetic field generator which generates a magnetic field region around a direction of the magnetic field passing through a plasma region in which a plasma is to be generated and converges charged particles including ion emitted from the plasma region toward the direction of the magnetic field, a first charged particle collector (receiver) mounted at both sides of an axis of the magnetic field in the magnetic field region in order to collect (receive) the charged particles converged by the magnetic field, a target supply unit supplying a target from a nozzle located outside a converging region in which the charged particles are to be converged inside the magnetic field region in an extreme ultraviolet light generating chamber, and a target collector located at a position opposite to the nozzle, the target retrieval portion retrieving a residual target which does not contribute to generation of the plasma.

12 Claims, 15 Drawing Sheets

PLASMA LUMINESCENCE POINT

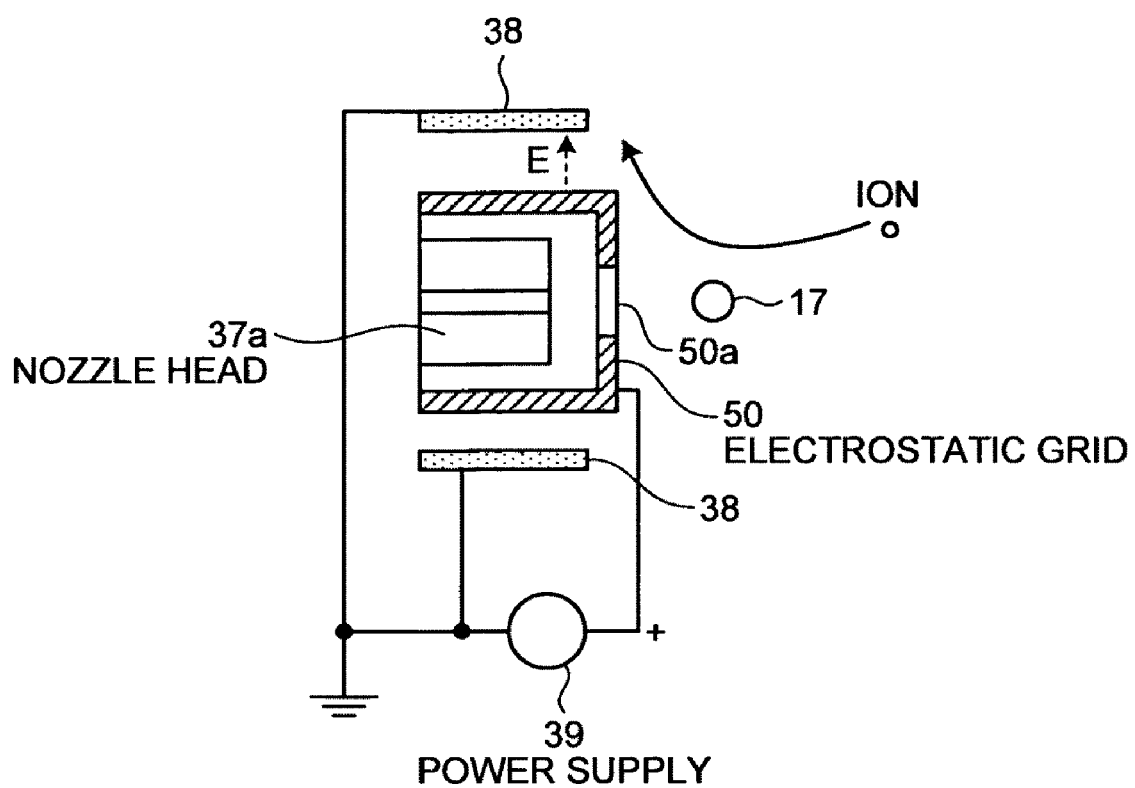

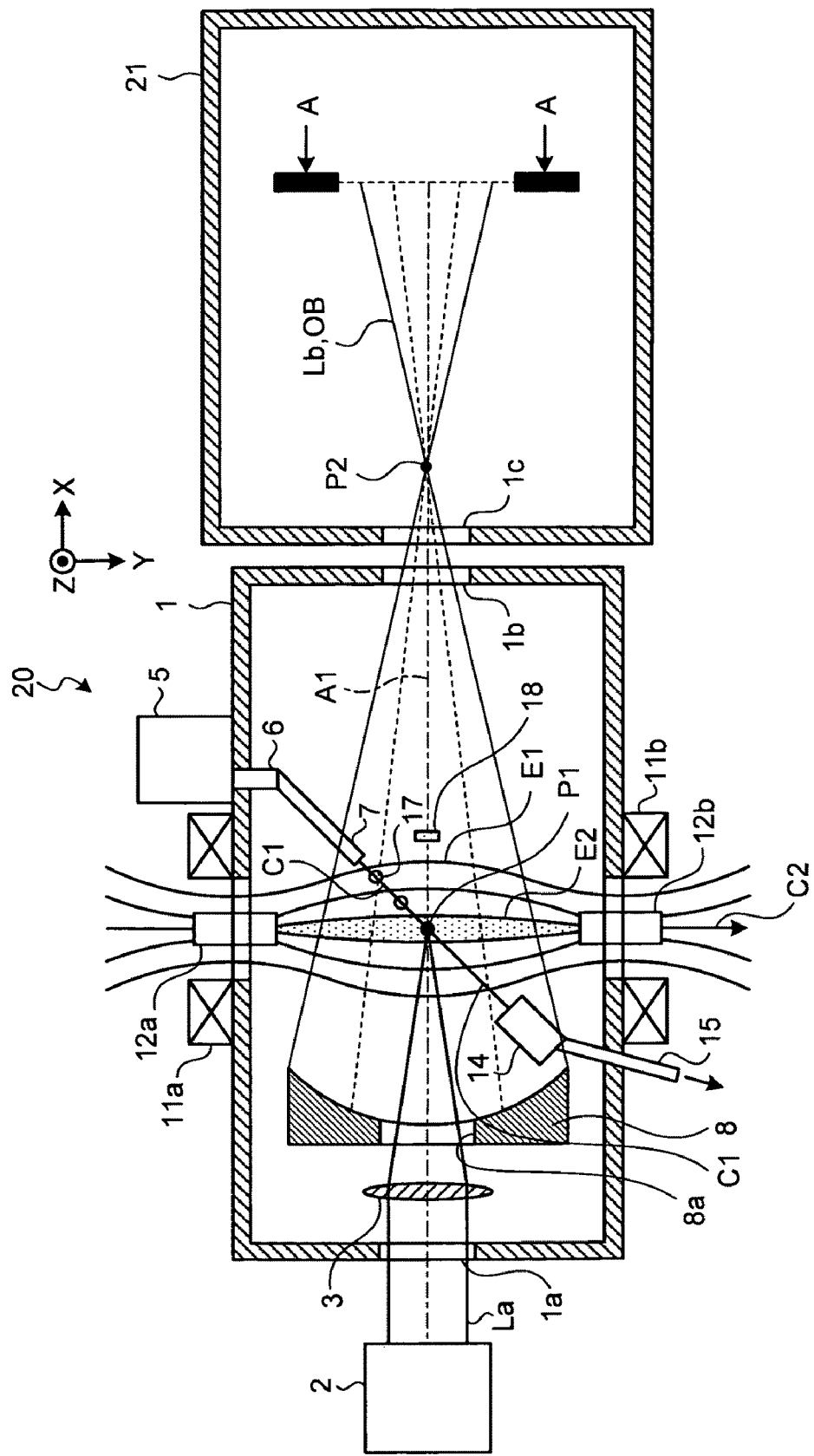

A-A CROSS-SECTION

B-B CROSS-SECTION

EXTREME ULTRAVIOLET LIGHT SOURCE APPARATUS

CROSS-REFERENCE TO RELATED APPLICATIONS

This application is based upon and claims the benefit of priority from the prior Japanese Patent Applications No. 2008-273504, filed on Oct. 23, 2008, and No. 2009-242868, filed on Oct. 21, 2009; the entire contents of which are incorporated herein by reference.

BACKGROUND OF THE INVENTION

1. Field of the Invention

The present invention relates to an extreme ultraviolet light source apparatus outputting an extreme ultraviolet light emitted from plasma generated by irradiating a target with a laser light.

2. Description of the Related Art

In recent years, along with a progress in miniaturization of semiconductor device, miniaturization of transcription pattern used in photolithography in a semiconductor process has developed rapidly. In the next generation, microfabrication to the extent of 70 nm to 45 nm, or even to the extent of 32 nm and beyond will be required. Therefore, in order to comply with the demand of microfabrication to the extent of 32 nm and beyond, development of such on exposure apparatus combining an extreme ultraviolet (EUV) light source for a wavelength of about 13 nm and a reflection-type reduction projection optical system is expected.

As the EUV light source, there are three possible types, which are a laser produced plasma (LPP) light source using plasma generated by irradiating a target with a laser beam, a discharge produced plasma (DPP) light source using plasma generated by electrical discharge, and a synchrotron radiation (SR) light source using orbital radiant light. Among these light sources, the LPP light source has the advantage of obtaining extremely high optical intensity close to the blackbody radiation because plasma density can be made higher than the DPP light source and the SR light source. Moreover, the LPP light source has the advantage of obtaining a strong light with a desired wavelength band by selecting a target material. Furthermore, the LPP light source is a point light source which has no electrode located around a luminous point and has a nearly isotropic angular distributions. Therefore, extremely wide collecting solid angle can be acquired. The LPP light source with the above-mentioned advantages has attracted attention as a light source for EUV lithography which requires more than several dozen to several hundred watt power.

In the EUV light source apparatus with the LPP system, firstly, a target material supplied inside a vacuum chamber is irradiated with a laser light to be ionized and thus generate plasma. Then, a cocktail light with various wavelength components including an EUV light is emitted from the generated plasma. The EUV light source apparatus collects the EUV light by reflecting the EUV light using an EUV collector mirror which selectively reflects the EUV light with a desired wavelength component, such as a 13.5 nm wavelength component, for instance. The collected EUV light enters an exposure apparatus. On a reflective surface of the EUV collector mirror, a multilayer coating, with a structure in that thin coatings of molybdenum (Mo) and thin coatings of silicon (Si) are alternately stacked, for instance, is formed. The multilayer coating has a high reflectance ratio (of about 60% to 70%) for the EUV light with a 13.5 nm wavelength.

Here, as mentioned above, plasma is generated by irradiating a target with a laser light, and at the same time, particles (debris) such as gaseous ion particles and neutral particles, and tiny particles (metal cluster) which have not been able to become plasma fly out around thereof from a plasma luminescence point. The debris fly toward surfaces of various optical elements such as an EUV collector mirror located in the vacuum chamber, focusing mirrors for focusing a laser light on a target, and other optical system for measuring an EUV light intensity, and so forth. Therefore, fast ion debris with comparatively high energy erode surfaces of optical elements and damage reflective coating of the surfaces. As a result, the surfaces of the optical elements will become a metal component, which is a target material. On the other hand, slow ion debris with comparatively low energy and neutral particle debris will deposit on surfaces of optical elements. As a result, a layer of a compound of metal, which is a target material, is formed on the surfaces of the optical elements. As a result of the debris entering as mentioned above, the reflective coating of each optical element is damaged or a compound layer is formed on the surfaces of the optical elements, whereby reflectance or transmittance of the optical elements decrease and the optical elements become unusable.

In this respect, Japanese patent application Laid-Open No. 2005-197456 discloses a technique such that debris flying from plasma are trapped by a magnetic field generated inside an optical collecting system by a magnetic field generator when current is supplied to the magnetic field generator. According to this technique, by locating a luminescence point of an EUV light within the magnetic field, ion debris flying from the plasma generated around the luminescence point converge in a direction of the magnetic field by Lorentz force by the magnetic field. As a result, contamination of neighboring optical elements with debris and damages of the optical elements can be reduced.

However, in the above-mentioned Japanese Patent Application Laid-Open No. 2005-197456, because a target nozzle is located on the same axis with a magnetic field direction, fast ion debris moving along the magnetic field collide with the target nozzle. As a result, the target nozzle head will be sputtered by ion collision, whereby a shape of the nozzle head will change. Change of the shape of the nozzle head degrades a position stability of a droplet in a case, for instance, where the target is supplied to the plasma luminescence point as the droplet. Furthermore, the nozzle being sputtered induces another factor of contamination of optical elements such as materials of the nozzle released by the sputtering adhering to the optical elements.

As a technique to solve the above-mentioned problems, for example, Japanese Patent Application Laid-Open No. 2007-207574 discloses a structure with which collision of debris against a nozzle and optical elements located in a direction for supplying droplet is reduced by arranging the nozzle in a direction perpendicular to a magnetic field direction.

BRIEF SUMMARY OF THE INVENTION

In accordance with one aspect of the present invention, an extreme ultraviolet light source apparatus generating an extreme ultraviolet light from plasma generated by irradiating a target with a laser light, the extreme ultraviolet light source apparatus comprises: a magnetic field generator which generates a magnetic field region around a direction of the magnetic field passing through a plasma region in which the plasma is to be generated and converges charged particles including ion emitted from the plasma region toward the direction of the magnetic field; a first charged particle collector (receiver) mounted at both sides of an axis of the magnetic field in the magnetic field region in order to collect (receive) the charged particles converged by the magnetic field; a target supply unit supplying a target from a nozzle located outside a converging region in which the charged particles are to be converged inside the magnetic field region in an extreme ultraviolet light generating chamber; and a target collector located at a position opposite to the nozzle, the target collector collecting a residual target which does not contribute to generation of the plasma.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

FIG. 14 is a vertical cross-sectional view showing a structure around a nozzle head in an extreme ultraviolet light source apparatus according to a second alternate example of the third embodiment;

FIG. 16 is a vertical cross-sectional view of an extreme ultraviolet light source apparatus according to a fourth embodiment of the present invention when the extreme ultraviolet light source apparatus is cut at a face including an optical axis of an EUV light;

DETAILED DESCRIPTION OF THE INVENTION

Exemplary embodiments of an extreme ultraviolet light source apparatus according to the present invention will be described below in detail with reference to the accompanying drawings.

First Embodiment

Figure 1:
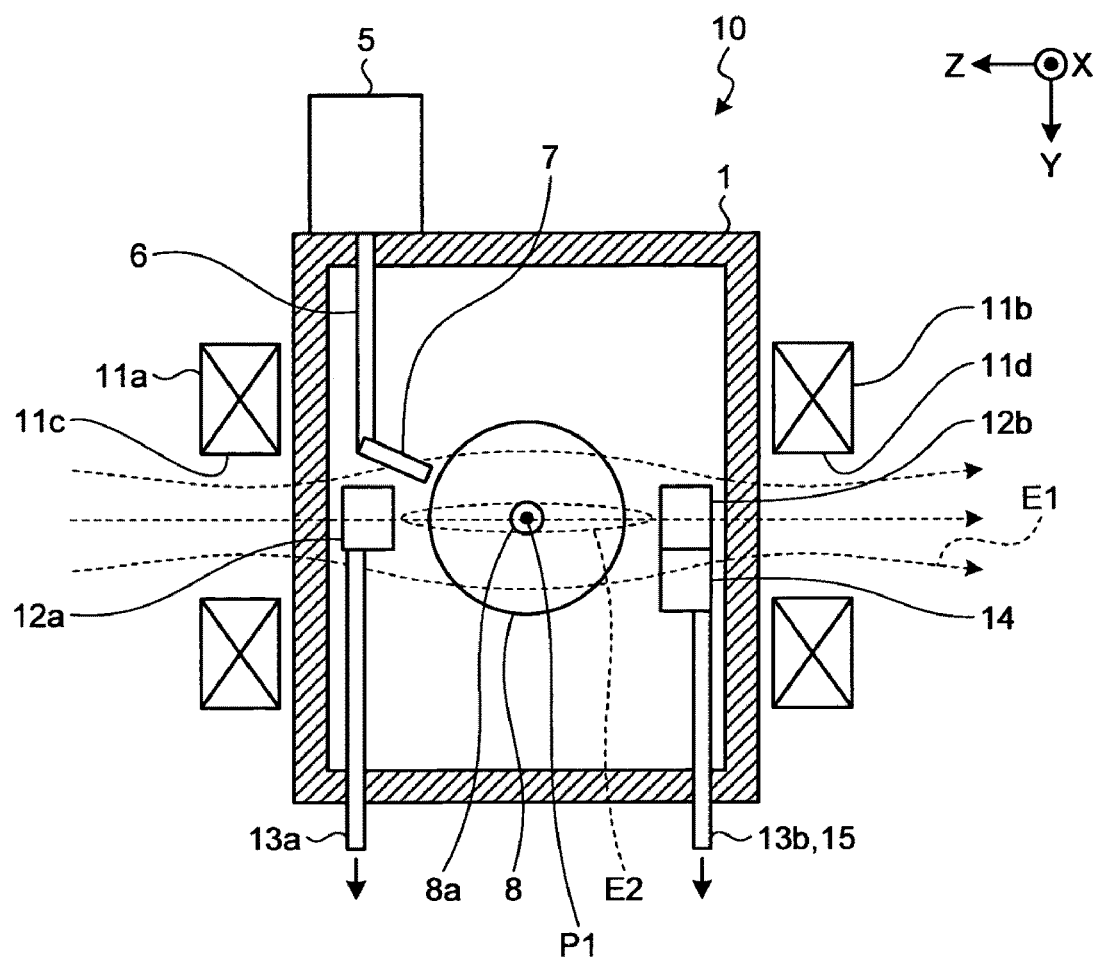
FIG. 1 is a vertical cross-sectional view of an extreme ultraviolet light source apparatus according to a first embodiment of the present invention when the extreme ultraviolet light source apparatus is cut at a cross-sectional face perpendicular to an optical axis of an EUV light.
Figure 2:
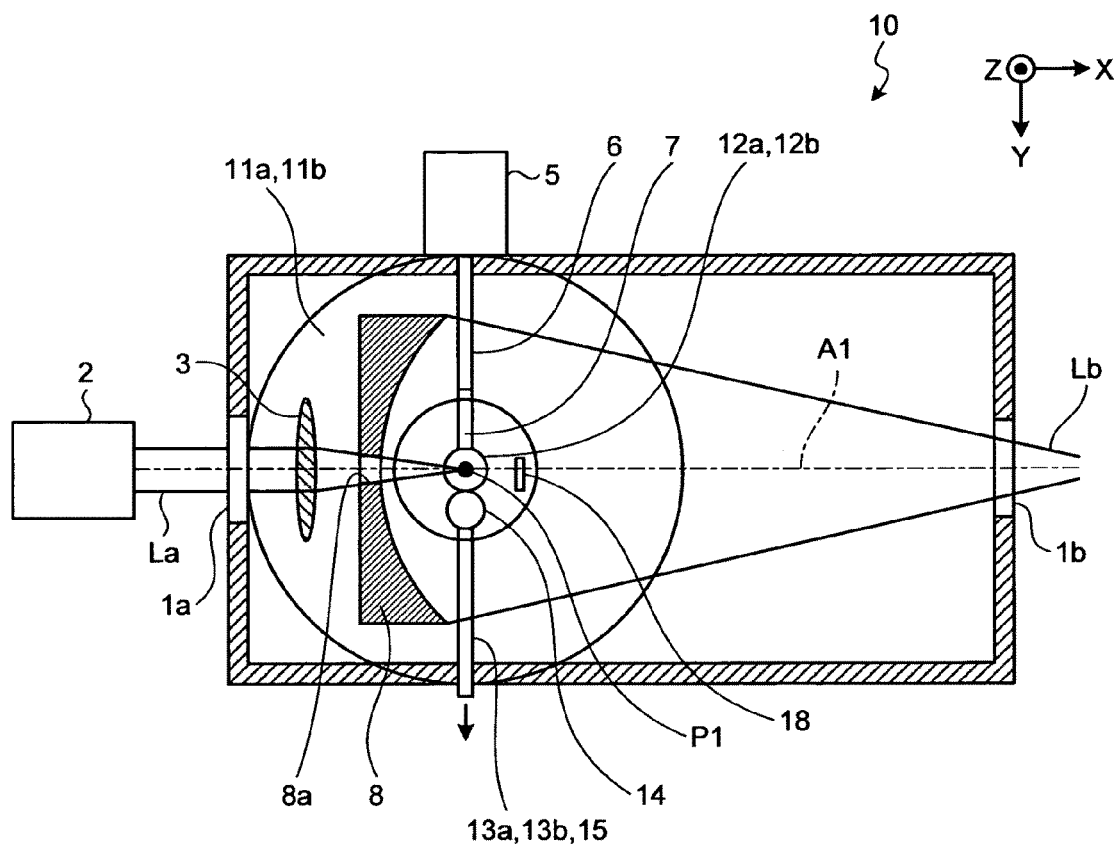
FIG. 2 is a vertical cross-sectional view of the extreme ultraviolet light source apparatus according to the first embodiment when the extreme ultraviolet light source apparatus is cut at a face including the optical axis of the EUV light.
Figure 3:
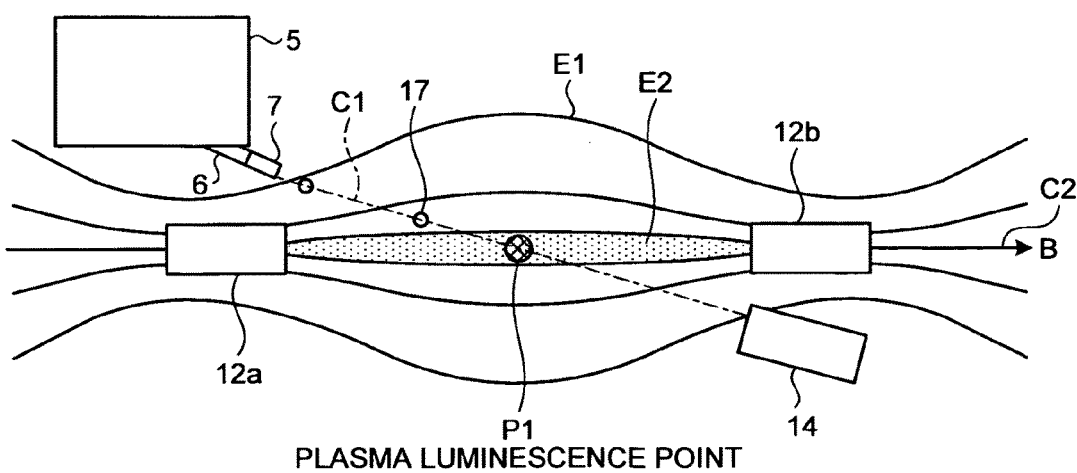
FIG. 3 is a schematic view showing a state around a plasma luminescence point.

FIG. 1 is a vertical cross-sectional view of an extreme ultraviolet light source apparatus according to a first embodiment of the present invention when the extreme ultraviolet light source apparatus is cut at a cross-sectional face perpendicular to an optical axis of an EUV light. FIG. 2 is a vertical cross-sectional view of the extreme ultraviolet light source apparatus according to the first embodiment when the extreme ultraviolet light source apparatus is cut at a face including the optical axis of the EUV light. FIG. 3 is a schematic view showing a state around a plasma luminescence point. In FIGS. 1 to 3, the extreme ultraviolet light source apparatus has a vacuum chamber 1 where a plasma luminescence point P1 is located at a central position of the vacuum chamber 1. A $CO_2$ pulse laser light La emitted from a drive laser 2 located outside the vacuum chamber 1 is inputted inside the vacuum chamber 1 through a window 1a for inputting a laser light in the vacuum chamber 1. The $CO_2$ pulse laser light La is focused on the plasma luminescence point P1 via a light focusing optical system 3 and an aperture 8a of an EUV collector mirror 8 in the vacuum chamber 1.

Furthermore, a Sn tank 5 mounted outside the vacuum chamber 1 stores a molten metal of Sn, and ejects a droplet 17 of Sn, which is a target, from a nozzle 7 through a supply tube 6. The nozzle 7 ejects the droplet 17 so that the droplet 17 passes through the plasma luminescence point P1. Here, an ejection timing and a pulse timing of the $CO_2$ pulse laser light La for each droplet 17 are controlled to be synchronous by a controller (not shown) so that each droplet 17 is irradiated with the $CO_2$ pulse laser light La at the plasma luminescence point P1. A laser dumper 18 is arranged for absorbing the laser light from the drive laser 2.

In the vacuum chamber 1, the EUV collector mirror 8 is arranged. The EUV collector mirror 8 reflects an EUV light Lb emitted from a plasma generated by irradiating the droplet with the $CO_2$ pulse laser light La so that the EUV light Lb is focused. The reflected EUV light Lb is outputted to an exposure apparatus (not shown) via a vacuum valve 1b. Here, a spectrum filter transmitting only an EUV light with a desired wavelength can be arranged in place of the vacuum valve 1b. A specific example of the spectrum filter can be a thin film filter of Zr, or the like.

Here, in the vacuum chamber 1, a pair of magnets 11a and 11b sandwiching the plasma luminescence point P1 in between are arranged. The magnets 11a and 11b generate a magnetic field of which an axis direction passes through the plasma luminescence point P1 for controlling a moving direction of charged particles including ions generated at the plasma luminescence point P1. In this case, the magnet is a superconducting magnet or a magnet coil. The charged particles (also referred to as ion debris) such as $Sn^+$ ion, electron, and so forth, diffusing from Sn plasma converge within a certain range lying along a magnetic direction based on a valence and energy of the charged particles and a magnetic flux density at a location of the charged particles.

The charged particles converged within a convergence region E2 are collected (received) by charged particle collection (receiving) cylinders 12a and 12b mounted at both edges of a direction of applied magnetic field passing through the plasma luminescence point P1. Furthermore, droplets which did not contribute to generation of the EUV light Lb although being ejected from the nozzle are collected by target collection cylinders 14 located at positions facing to each other while sandwiching the plasma luminescence point P1 in between.

Here, in this particular embodiment, the droplet which did not contribute to generation of the EUV light Lb means a droplet corresponding to either one of the following two droplets. The first one is a droplet irradiated with a laser light however the target material did not contribute to an EUV luminescence (a deformed droplet, a scattered tiny particle). The second one is a droplet which was not irradiated with a laser light. In addition, the second droplet is a droplet in a case where a track of the droplet (track C1 of droplet: cf. FIG. 3) does not pass through an irradiation position of a laser light (the plasma luminescence point P1) or a case where the droplet (target material) is not irradiated with a laser light even if the droplet passes through the irradiation position.

The charged particle collection (receiving) cylinders 12a and 12b and the target collection cylinder 14 can have drain tubes 13a, 13b and 15 for ejecting the collected Sn outside of the vacuum chamber 1. The collected Sn can be melted in order to be ejected easily. In this case, the drained Sn can be supplied to the Sn tank 5 again after a recycle process.

The nozzle 7, the supply tube 6, the charged particle collection (receiving) cylinders 12a and 12b, the target collection cylinder 14 and the drain tubes 13a, 13b and 15 are located inside a space between the EUV collector mirror 8 and the magnets 11a and 11b, for instance. However, it is not limited to the above arrangement, while the nozzle 7, the supply tube 6, the charged particle collection (receiving) cylinders 12a and 12b, the target collection cylinder 14 and the drain tubes 13a, 13b and 15 can be located in such a way as not to prevent generation and collection of the EUV light Lb. In this arrangement, it is preferable that the nozzle 7, the supply tube 6, the charged particle collection (receiving) cylinders 12a and 12b, the target collection cylinder 14 and the drain tubes 13a, 13b and 15 are located as close to the plasma luminescence point P1 as possible.

Here, the nozzle 7 is located outside the convergence region E2 and near the charged particle collection (receiving) cylinder 12a. Furthermore, the charged particle collection (receiving) cylinder 12b and the target collection cylinder 14 can be combined in one. That is, charged particles and droplet can be collected by a single retrieval cylinder. This is because by locating the nozzle 7 near the charged particle collection (receiving) cylinder 12a, the target collection cylinder 14 facing the nozzle 7 can be located near the charged particle collection (receiving) cylinder 12b. Thereby, it is possible to reduce collision between charged particles, which are to be collected by the charged particle collection (receiving) cylinders 12a and 12b, and the nozzle 7, and thus, it is possible to prevent the nozzle 7 from deteriorating. In addition, when the charged particle collection (receiving) cylinder 12b and the target collection cylinder 14 are combined in one, it is possible to make the drain tube 13b and 15 a single drain tube. Furthermore, it is preferable that the charged particle collection (receiving) cylinders 12a and 12b, the target collection cylinder 14 and the drain tubes 13a, 13b and 15 are heated to a temperature of 300 degrees Celsius in order to melt Sn accumulated in the charged particle collection (receiving) cylinders 12a and 12b and the target collection cylinder 14. Whereby, it is possible to liquidize the Sn accumulated in the particle collection (receiving) cylinders 12a and 12b and target collection cylinder 14a and easily eject the accumulated Sn to the external via the drain tubes 13a, 13b and 15 after liquidizing the accumulated Sn.

Furthermore, in the first embodiment, as shown in FIG. 3, due to the magnetic field direction axis C2 and the ejection direction axis C1 of the droplet 17 being arranged crossways as having slopes while facing toward approximately the same direction, when the droplet is charged, there is hardly any case where the droplet 17 passing through a magnetic field region E1 drifts from the ejection direction axis C1 of the droplet 17 due to Lorentz force. As a result, it is possible to easily control irradiation to the droplet 17 while an irradiation accuracy of the $CO_2$ pulse laser light with respect to the droplet 17 can be increased.

Figure 4:
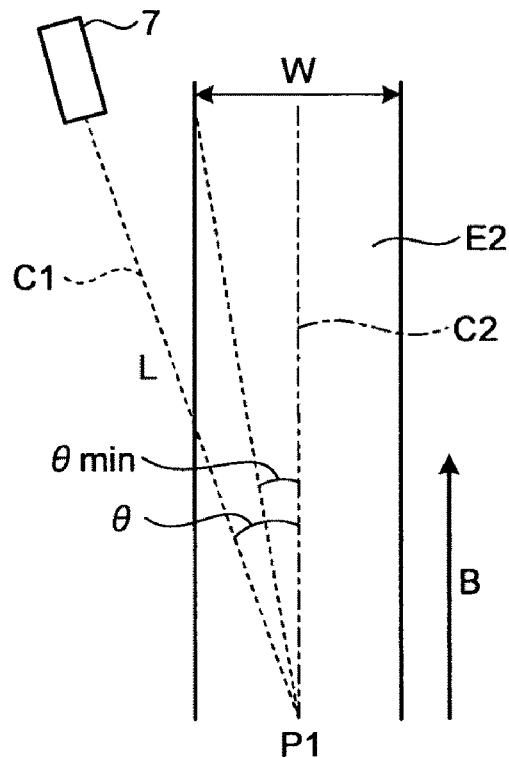
FIG. 4 is a schematic view for explaining a tilt angle of a nozzle.
Figure 5:
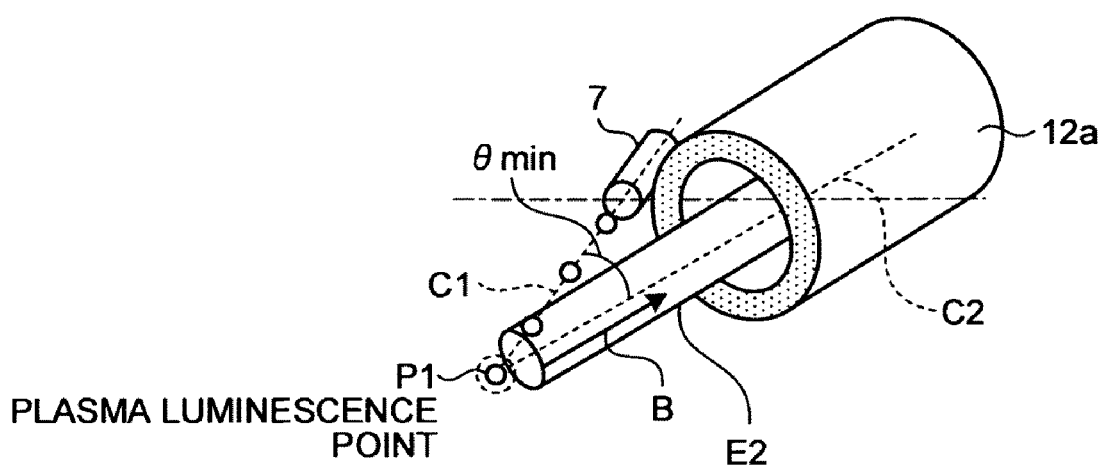
FIG. 5 is a schematic view for explaining a relationship among the nozzle, a converging portion and a collection cylinder.
Figure 6:
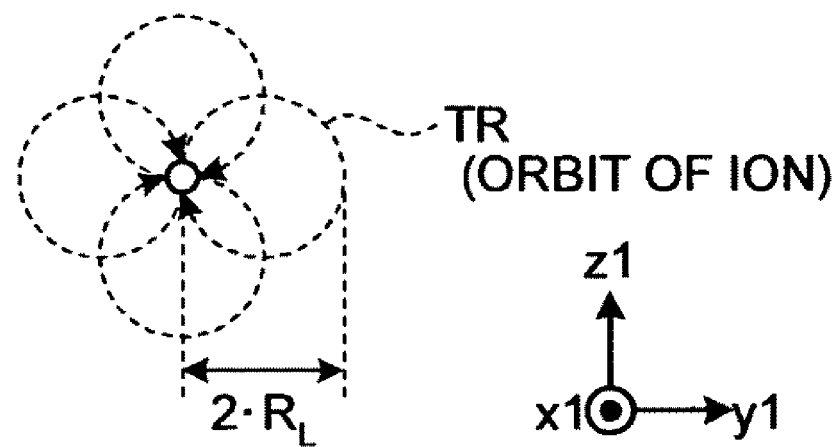
FIG. 6 is a schematic view for explaining Larmar radius.
Figure 7:
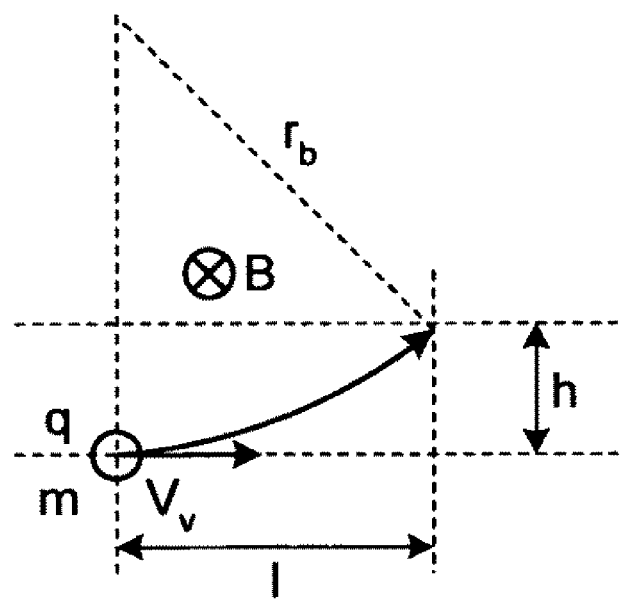
FIG. 7 is a schematic view showing a movement of a droplet inside a magnetic field.
Figure 8:
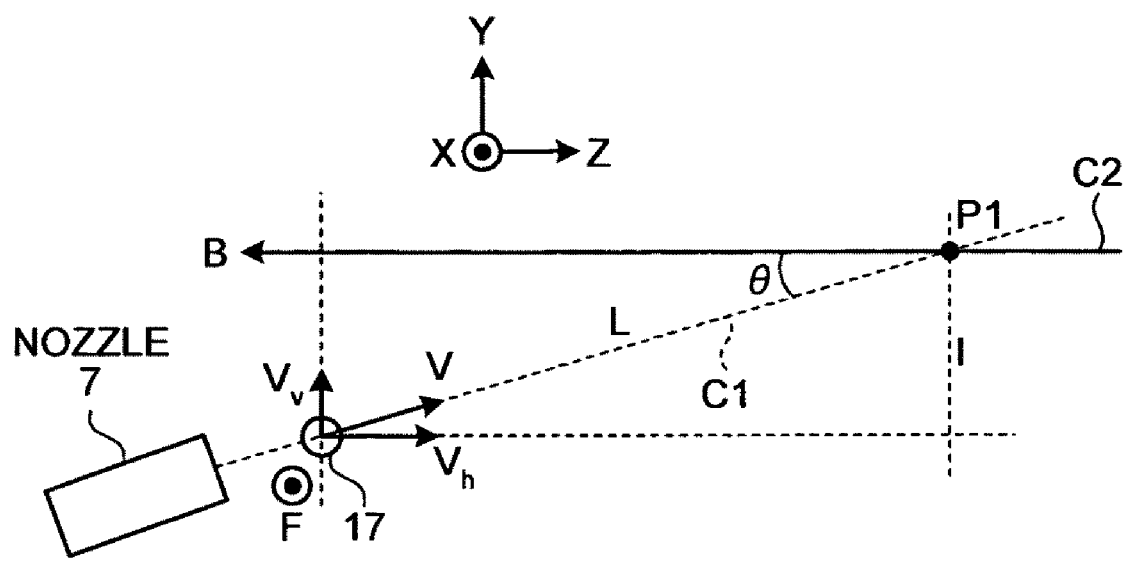
FIG. 8 is a schematic view for explaining a movement of an emitted droplet inside the magnetic field.
Figure 9:
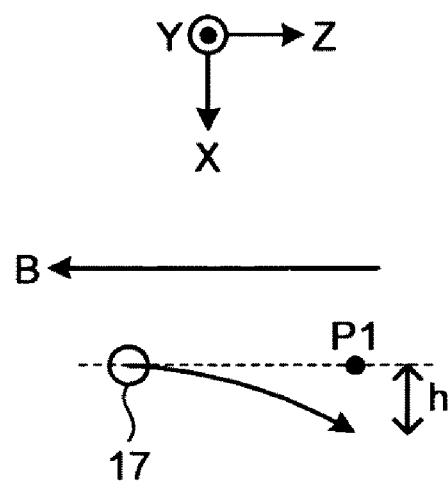
FIG. 9 is a schematic view for explaining a movement of a droplet in the magnetic field.

Next, the angle (tilt angle) between the magnetic field direction axis C2 and the ejection direction axis C1 of the droplet 17 will be described in detail. FIG. 4 is a schematic view for explaining a tilt angle of a nozzle. FIG. 5 is a schematic view for explaining a tilt of the nozzle. FIG. 6 is a schematic view for explaining Larmar radius. FIG. 7 is a schematic view showing a movement of a droplet inside a magnetic field. FIG. 8 is a schematic view for explaining a displacement of an emitted droplet inside the magnetic field. FIG. 9 is a schematic view for explaining a movement of a droplet inside the magnetic field. Firstly, as shown in FIG. 4, when a distance from the nozzle 7 to the plasma luminescence point P1 is L, a width of the convergence region E2 is W, and the tilt angle is θ, the tilt angle θ is represented as the following formula 1.

$$\theta = \arcsin(W/2L) \quad \text{(formula 1)}$$

Here, when a magnetic flux density is B, an energy of charged particle (ion) is E, a mass of the charged particle is m, a valence of ion is n, and an electric charge is q, as shown in FIG. 6, Larmar radius $R_L$ that can be determined by a track TR is represented as the following formula 2.

$$R_L = \mathrm{SQRT}(2mE/nQB) \quad \text{(formula 2)}$$

Here, because the width W is $4R_L$, a minimum tilt angle θmin in a case when the nozzle 7 is located outside the convergence region E2 is determined as the following formula 3.

$$\theta_{min} = \arcsin(2\mathrm{SQRT}(2mE/nQBL)) \quad \text{(formula 3)}$$

Accordingly, as shown in FIG. 4, the above-described tilt angle θ of the nozzle 7, namely the angle between the ejection direction angle C1 of the droplet 17 and the magnetic field direction axis C2 of the magnetic field region E1, can be set to be equal to or greater than the minimum tilt angle θmin.

For example, in a case of the magnetic flux density B=1[T], the energy E=0.6 [KeV], the valence of ion n=2.5, and the distance L=250 [mm], the θmin becomes 9.1 [deg]. That is, in this case, by making the tilt angle θ between the ejection direction axis C1 of the droplet 17 and the magnetic field direction axis C2 of the magnetic field region E1 set as greater than 9.1 [deg], it is possible to prevent the charged particles from colliding with the nozzle 7.

Here, if the droplet 17 is being charged in order to draw out a particular droplet, or the like, the charged droplet 17 is to be influenced by Lorentz force. That is, the charged droplet 17 will be influenced by a vertical component Vv perpendicular to the magnetic field direction, from among the components in a self velocity direction. As an example, a case where the droplet 17 with mass m and valence q moves in a uniform circular motion under the magnetic flux density B will be considered. In this case, as shown in FIG. 7, while the droplet moves a distance 1 along a direction perpendicular to the magnetic field direction, the droplet 17 influenced by Lorentz force by as much as a movement h which is represented as the following formula 4.

$$h=(l^2qB)/(2mVv) \quad \text{(formula 4)}$$

Accordingly, as shown in FIG. 8, if the droplet 17 was ejected with the tilt angle θ with respect to the magnetic field direction axis C2, a vertical component Vv and a horizontal component Vh of an initial velocity V with respect to the magnetic field direction axis C2 is represented as the following formula 5, and the distance 1 that the droplet 17 passes across the magnetic field while the droplet 17 moves the distance L up to the plasma luminescence point P1 is represented as the following formula 6. Therefore, as shown in FIG. 9, the movement h where the droplet 17 receives toward a direction perpendicular to the magnetic field direction axis C2 is represented as the following formula 7.

$$Vv=V \sin θ;$$

$$Vh=V \cos θ \quad \text{(formula 5)}$$

$$132 \, L \sin θ \quad \text{(formula 6)}$$

$$h=(L^2qB \sin θ)/(2Vm) \quad \text{(formula 7)}$$

Here, when a maximum movement for enabling a position control to control the position of the $CO_2$ pulse laser light to the plasma luminescence point P1 is h', a maximum angle θmax of the tilt angle θ is represented as the following formula 8.

$$θmax=\arcsin(2Vmh'/L^2qB) \quad \text{(formula 8)}$$

That is, the tilt angle θ can be tilted as far as to the maximum angle θmax. According to the above description, it can be understood that the tilt angle θ should satisfy the condition θmin<θ<θmax.

Second Embodiment

Figure 10:
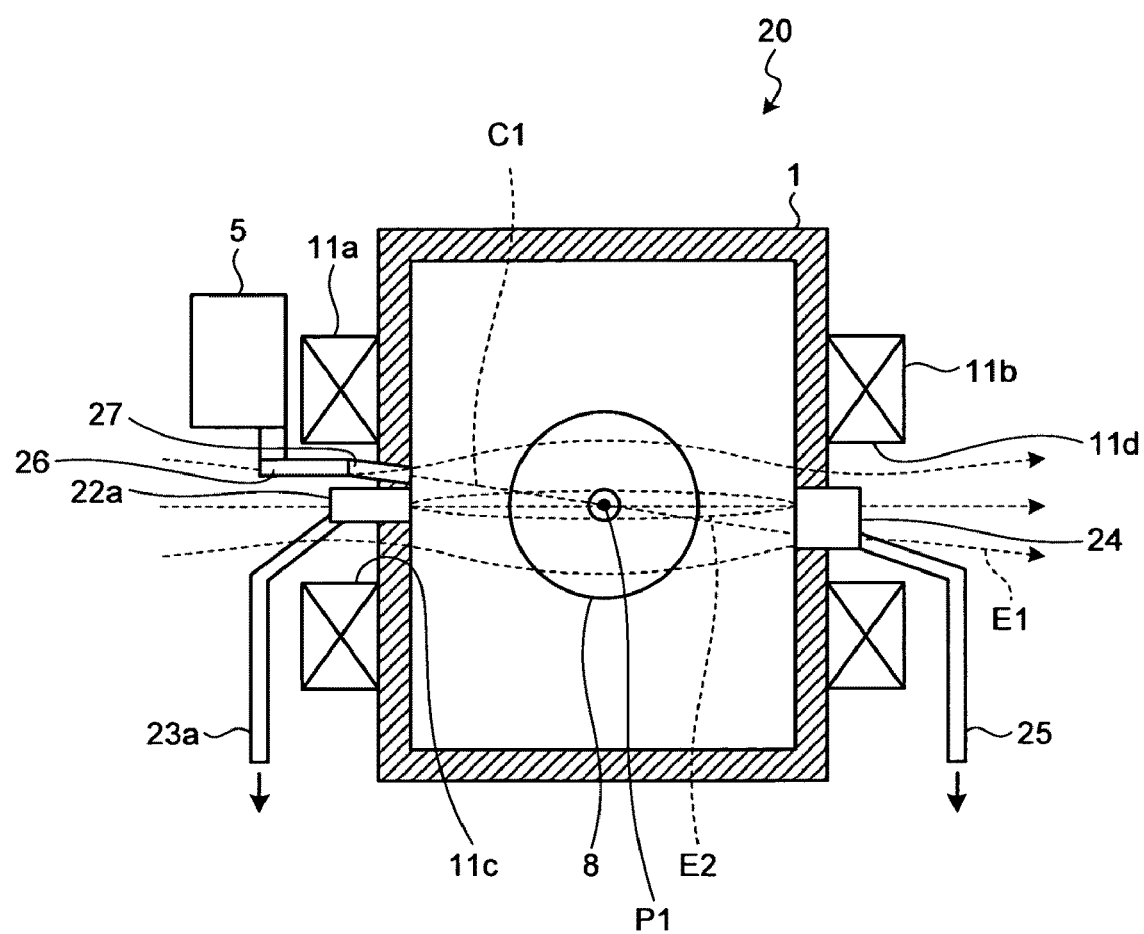
FIG. 10 is a vertical cross-sectional view of an extreme ultraviolet light source apparatus according to a second embodiment of the present invention when the extreme ultraviolet light source apparatus is cut at a cross-sectional face perpendicular to an optical axis of an EUV light.

Next, a second embodiment of the present invention will be described in detail. In the above-described first embodiment, the nozzle 7, the supply tube 6, the charged particle collection (receiving) cylinders 12a and 12b, the target collection cylinder 14, and the drain tubes 13a, 13b and 15 are located in the space between the EUV collector mirror 8 and the magnets 11a and 11b. On the other hand, in the second embodiment, as shown in FIG. 10, a nozzle 27, a part of a supply tube 26, a charged particle collection (receiving) cylinder 22a, a collection cylinder 24 which collects (receives) both charged particles and targets, and parts of drain tubes 23a and 25 are located in bores 11c and 11d, respectively. FIG. 10 is a vertical cross-sectional view of an extreme ultraviolet light source apparatus according to a second embodiment of the present invention when the extreme ultraviolet light source apparatus is cut at a cross-sectional face perpendicular to an optical axis of an EUV light.

In the second embodiment, because the nozzle 27, the charged particle collection (receiving) cylinder 22a, the collection cylinder 24, and so on, are located in the bores 11a and 11d, it is possible to shorten an interval between the magnets 11a and 11b. As a result, it is possible to downsize the magnets 11a and 11b, and furthermore, it is possible to further downsize the extreme ultraviolet light source apparatus as a whole.

Third Embodiment

Figure 11:
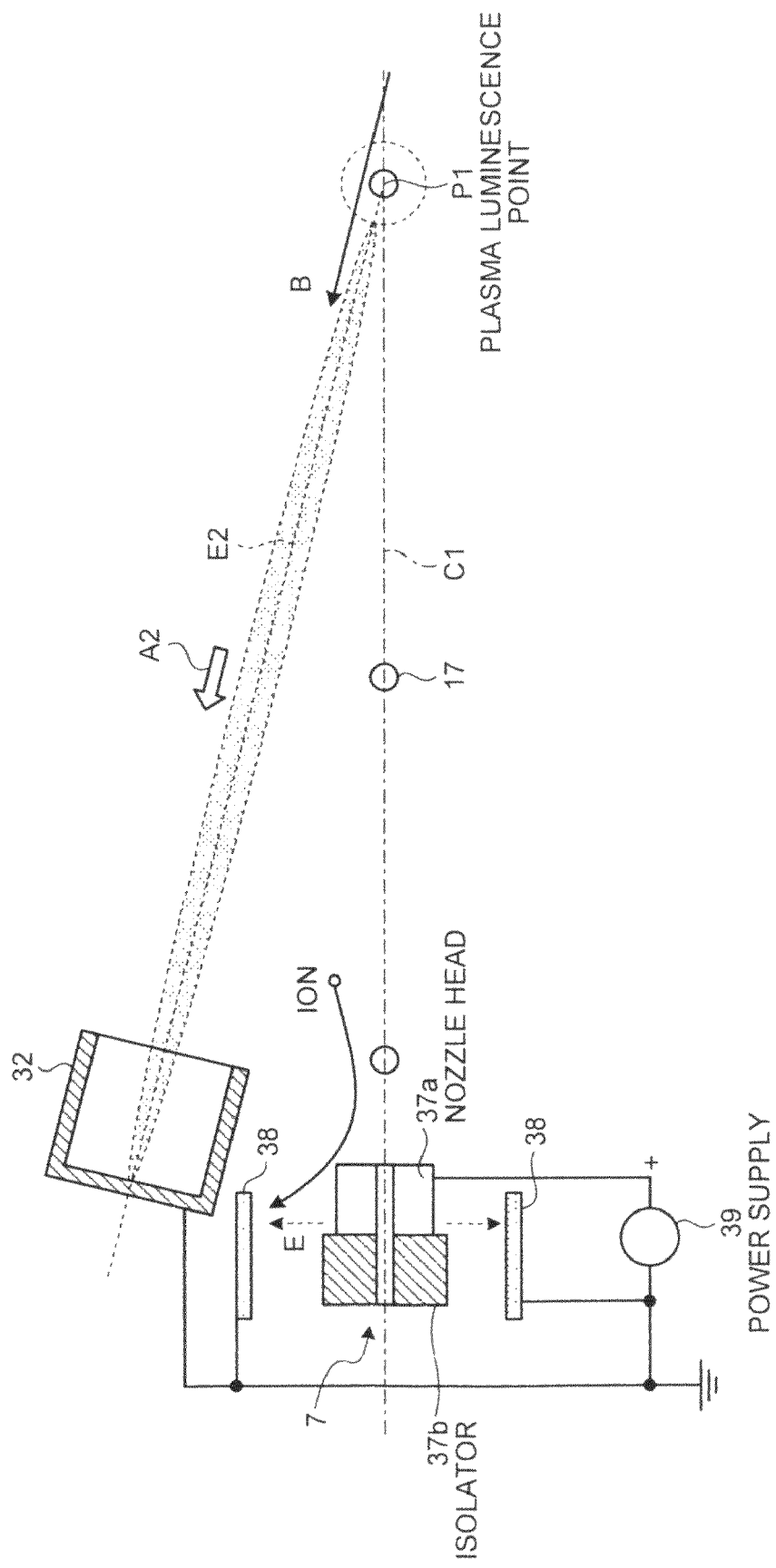
FIG. 11 is a cross-sectional view showing a structure around a nozzle head in an extreme ultraviolet light source apparatus according to a third embodiment of the present invention.
Figure 12:
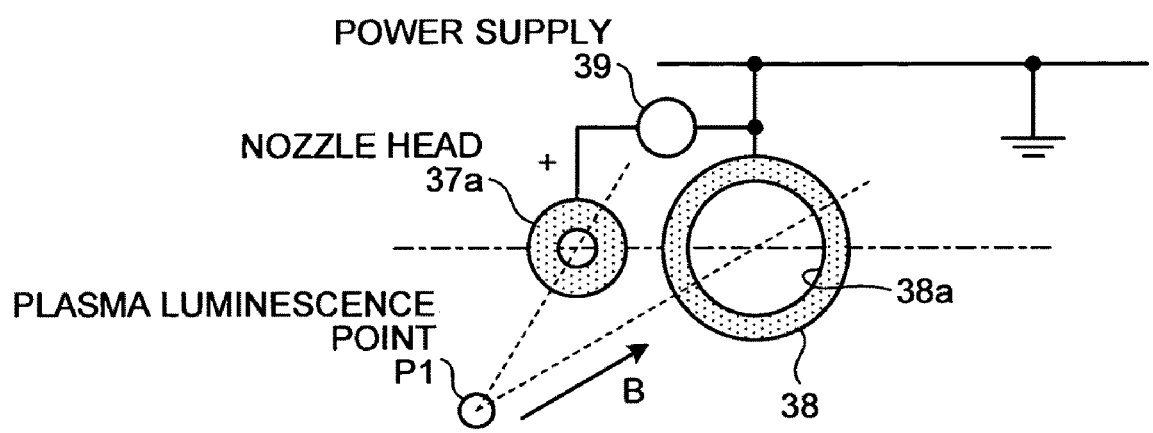
FIG. 12 is a schematic view showing a structure around the nozzle head in the extreme ultraviolet light source apparatus according to the third embodiment.

Next, a third embodiment of the present invention will be described in detail. In the third embodiment, as shown FIGS. 11 and 12, an electrical field generator is arranged around a nozzle head 37a. Thereby, chances of collision of charged particles against the nozzle can be reduced, whereby it is possible to effectively prevent deterioration of the nozzle. FIG. 11 is a cross-sectional view showing a structure around a nozzle head in an extreme ultraviolet light source apparatus according to the third embodiment of the present invention. FIG. 12 is a cross-sectional view showing a structure around a nozzle head in the extreme ultraviolet light source apparatus according to the third embodiment of the present invention.

Normally, the charged particles converged by the magnetic field near the plasma luminescence point P1 is collected (received) by a charged particle collection (receiving) cylinder 32. However, in such a case where the charged particle has energy greater than expected, there is a possibility that the high energy charged particle flies out toward the nozzle head 37a without converging within the magnetic field. Therefore, in the third embodiment, a charged particle collection (receiving) cylinder 38 covering the nozzle head 37a has a negative potential or a ground potential while the nozzle head 37a has a positive potential applied to by a power supply 39. Thereby, charged particles with a positive potential bounce back against the nozzle head 37a by Coulomb force between the charged particles and an electrical field being formed radially from the nozzle head 37a. As a result, it is possible to prevent collision between the positive charged particles and the nozzle head 37a. Furthermore, it is also possible to prevent the nozzle head 37a from being sputtered by decelerating the charged particles.

The charged particles ($Sn^+$) drifted from the track toward the nozzle head 37a by Coulomb force are collected after adhering to an inner wall of the charged particle collection (receiving) cylinder 38. It is preferable that a base of the nozzle head 37a is covered with an insulator 37b in order to be insulated from peripheral structures.

Figure 13A:
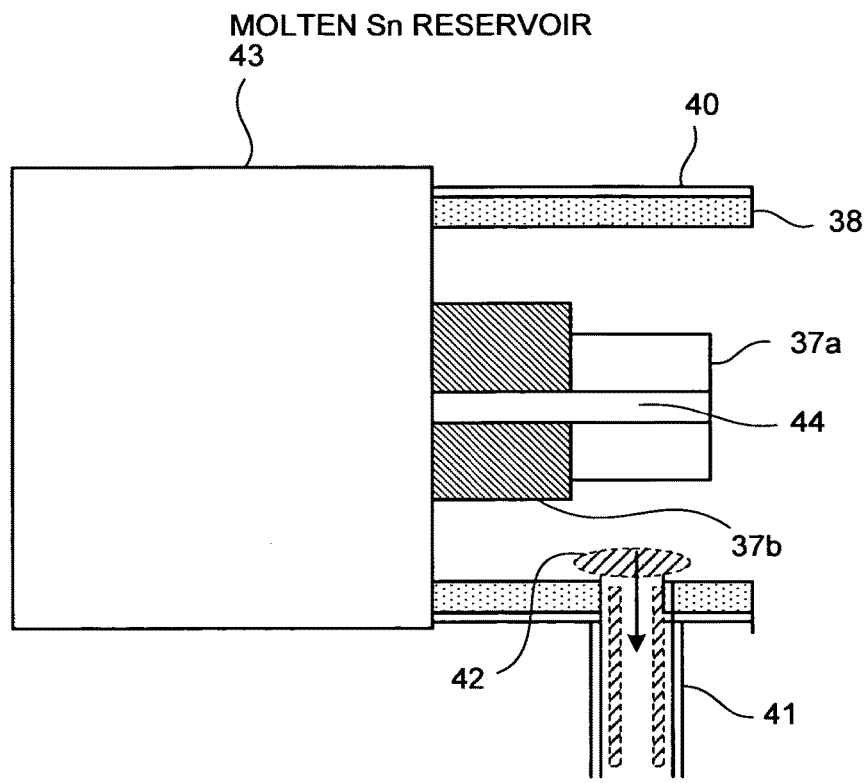
FIG. 13A is a lateral view showing a structure around a nozzle head in an extreme ultraviolet light source apparatus according to a first alternate example of the third embodiment.
Figure 13B:
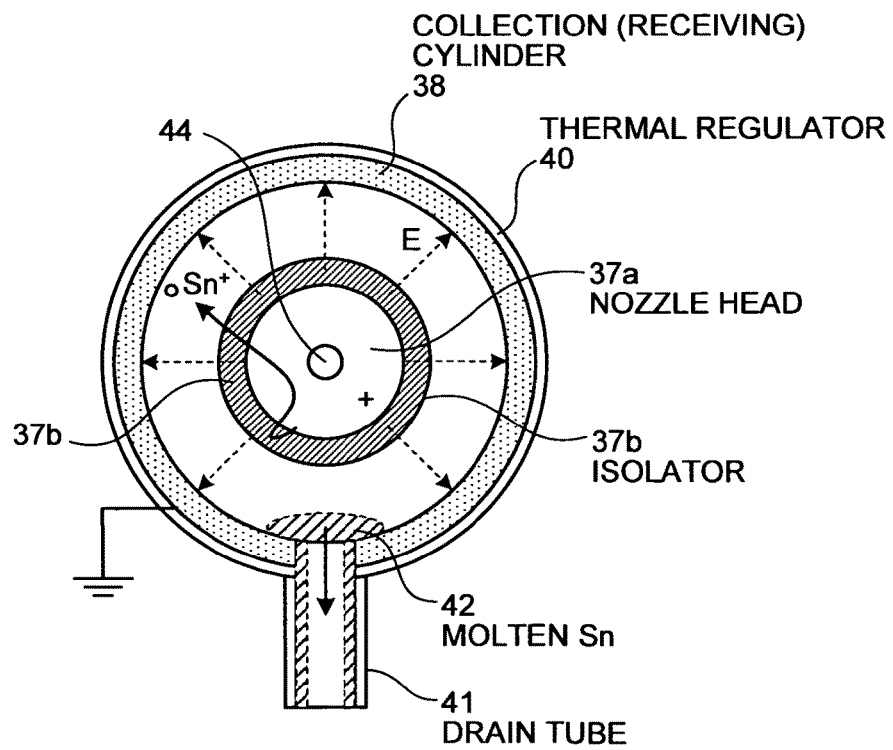
FIG. 13B is a cross-sectional view showing a structure around the nozzle head in the extreme ultraviolet light source apparatus according to the first alternate example of the third embodiment.

In addition, as shown in FIGS. 13A and 13B, the Sn adhered to the inner wall of the charged particle collection (receiving) cylinder 38 can be heated by a thermal regulator 40 mounted around the charged particle collection (receiving) cylinder 38 and a drain tube 41. Thereby, the adhered Sn liquidizes as a molten Sn 42 and is discharged from the drain tube 41, whereby the Sn can be easily collected. FIG. 13A is a lateral view showing a structure around a nozzle head in an extreme ultraviolet light source apparatus according to a first alternate example of the third embodiment. FIG. 13B is a cross-sectional view showing a structure around the nozzle head in the extreme ultraviolet light source apparatus according to the first alternate example of the third embodiment. The molten Sn 42 is supplied from a molten Sn reservoir 43 via a nozzle tube 44.

Figure 15A:
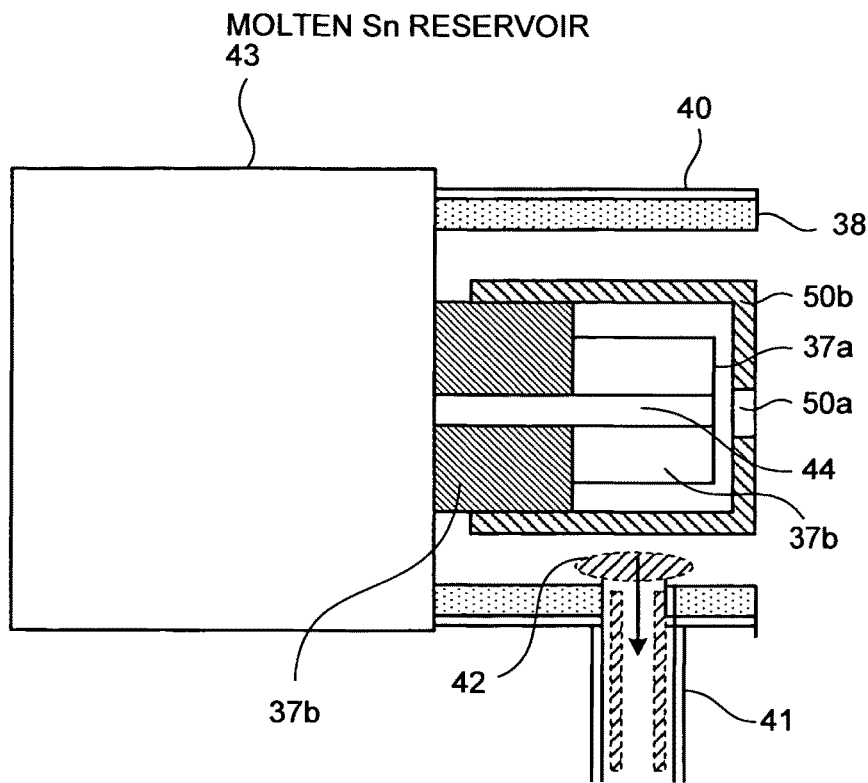
FIG. 15A is a lateral view showing a structure around the nozzle head in the extreme ultraviolet light source apparatus according to the second alternate example of the third embodiment.
Figure 15B:
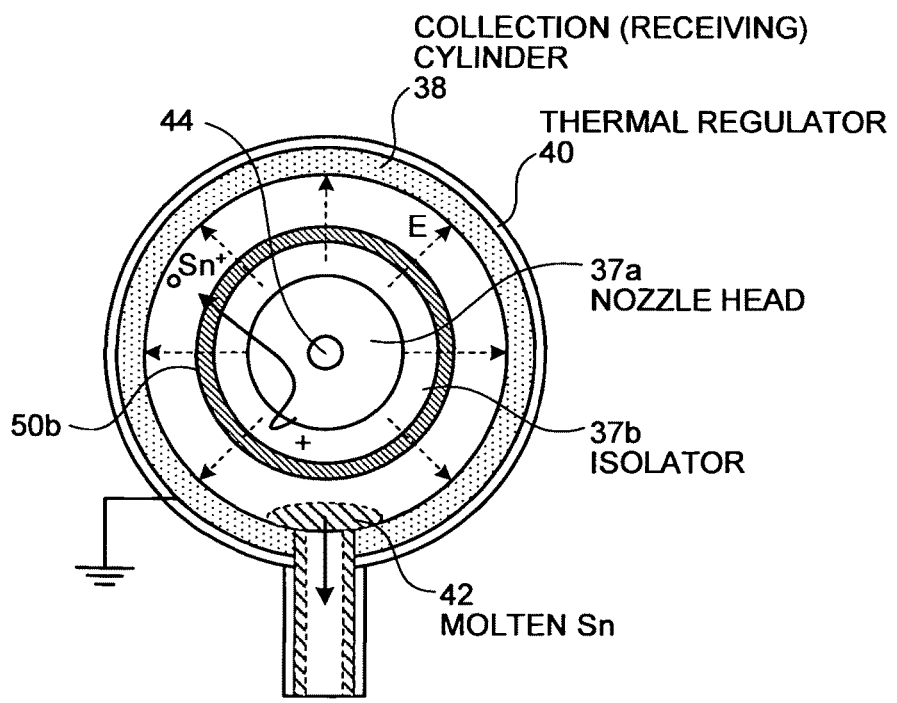
FIG. 15B is a horizontal cross-sectional view showing a structure around the nozzle head in the extreme ultraviolet light source apparatus according to the second alternate example of the third embodiment.

Furthermore, as shown in FIGS. 14, 15A and 15B, it is possible to arrange an electrostatic grid 50 having an ejection aperture 50a for ejecting the droplet 17 around the nozzle head 37a and apply a positive potential to the electrostatic grid 50. By this arrangement, as in the case where the nozzle head 37a has the position potential directly impressed, an electrical field is formed toward the charged particle collection (receiving) cylinder 38 from the electrostatic grid 50, and therefore, the electrostatic grid 50 can deflect tracks of the charged particles from the track toward the nozzle head 37a using Coulomb force that rebounds the charged particles. As a result, it is possible to let the charged particles flying out toward the nozzle head 37a adhere to the inner wall of the charged particle collection (receiving) cylinder 38. Furthermore, even if the track of the charged particle can not be sufficiently deflected and the charged particle reaches the electrostatic grid 50, it is possible to trap the charged particle by the electrostatic grid 50. Moreover, by controlling a temperature of the electrostatic grid 50, it is possible to liquidize depositions of the charged particles ($Sn^+$) having adhered to the electrostatic grid 50 so as to discharge and then collect the liquidized charged particles ($Sn^+$) as the molten Sn 42. FIG. 14 is a vertical cross-sectional view showing a structure around a nozzle head in an extreme ultraviolet light source apparatus according to a second alternate example of the third embodiment. FIG. 15 is a lateral view showing a structure around the nozzle head in the extreme ultraviolet light source apparatus according to the second alternate example of the third embodiment. FIG. 15B is a cross-sectional view showing a structure around the nozzle head in the extreme ultraviolet light source apparatus according to the second alternate example of the third embodiment. The molten Sn 42 is supplied from the molten Sn reservoir 43 via the nozzle tube 44.

Fourth Embodiment

Figure 17:
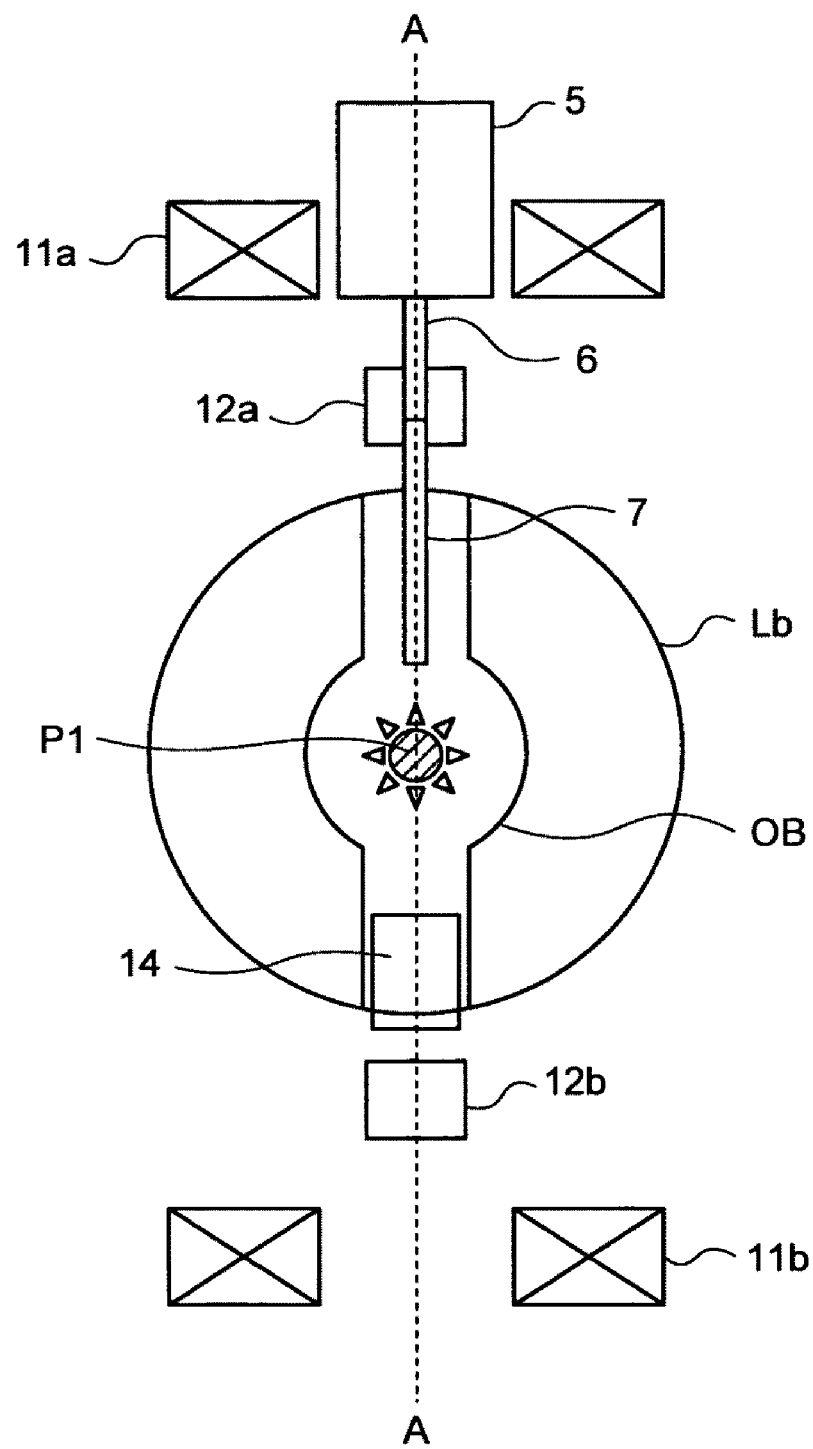
FIG. 17 is an illustration showing an example of a far field pattern transcribed on A-A surface in FIG. 16.

Next, a fourth embodiment of the present invention will be described in detail with reference to the accompanying drawings. FIG. 16 is a vertical cross-sectional view of an extreme ultraviolet light source apparatus according to a fourth embodiment of the present invention when the extreme ultraviolet light source apparatus is cut at a face including an optical axis of an EUV light. FIG. 17 is an illustration showing an example of a far field pattern transcribed on A-A surface in FIG. 16. In the following description, the far field pattern means a pattern transcribed on A-A plane (cf. FIG. 16) as the EUV light Lb reflected by the EUV collector mirror 8 passes through a focus position P2 in the EUV exposure apparatus 21.

Here, an obscuration region will be explained before explaining an extreme ultraviolet light source apparatus according to this particular embodiment. The obscuration region refers to a region E corresponding to an angular region in which EUV light Lb collected by the EUV collector mirror 4 is not used in the EUV exposure apparatus 11. That is, the EUV light emitted from the plasma luminescence point P1 is focused on the focus position P2 by the EUV collector mirror 4. In this explanation, a three-dimensional cubic region corresponding to the angular region in which the EUV light is not used in the exposure apparatus 11 at the focus position P2 is defined as the obscuration region OB. Usually, the EUV light in the obscuration region OB is not used for exposure in the EUV exposure apparatus 11. Therefore, even if the EUV light in the obscuration region OB is not inputted to the exposure apparatus, exposure performance and throughput of the exposure apparatus will not be influenced.

For this reason, in this particular embodiment, as will be described in detail later on, a head of the nozzle 7 (which may include the supply tube 6) is located inside the obscuration region OB. By this structure, it is possible to shorten an interval between the head of the nozzle 7 and the plasma luminescence point P1, and therefore, it is possible to improve a passing position stability of the droplet 17. As a result, it is possible to generate the EUV light Lb with stable intensity.

In addition, in the structure that the nozzle 7, and so forth, is located inside the obscuration region OB, because only energy (light intensity) in a region not used for exposure (transcribed pattern in the obscuration region OB) in the far field pattern (cf. FIG. 17) changes, such change will not influence the exposure in the EUV exposure apparatus 21.

Subsequently, the extreme ultraviolet light source apparatus 20 according to this particular embodiment will be described in detail. As shown in FIG. 16, the extreme ultraviolet light source apparatus 20 has a structure similar to the extreme ultraviolet light source apparatus 10 (show in FIG. 1, for instance) according to the first embodiment. However, as shown in FIGS. 16 and 17, in the extreme ultraviolet light source apparatus 20 according to this particular embodiment, at least the head of the nozzle 7 is located inside the obscuration region OB in the vacuum chamber 1 while facing toward the plasma luminescence point P1. Here, not only the head of the nozzle 7 but also a part or whole of the nozzle 7 and the supply tube 6 can be located inside the obscuration region OB. Furthermore, the target collection cylinder 14 is located on an extension of a line C1 that passes through the head of the nozzle 7 and the plasma luminescence point P1. In this arrangement, the head of the nozzle 7 and the target collection cylinder 14 are arranged in such a way that a line passing through the head of the nozzle 7 and the target collection cylinder 14, that is, the ejection direction axis C1 of the droplet 17, is included in a plane including an optical axis A1 of the EUV light Lb and the magnetic field direction C2. Accordingly, the ejection direction axis C1 is tilted toward the optical axis A1 from the magnetic field direction C2.

More specifically, it is preferable that the head of the nozzle 7 is located as close to the plasma luminescence point P1 as possible while being outside the convergence region E2 (cf. FIG. 3). Thus, by arranging the head of the nozzle 7 outside the convergence region E2, as in the above-described embodiments, it is possible to prevent the nozzle 7 from being damaged by the charged particles such as $Sn^+$ ion, electron, and so on, having diffused from Sn plasma at the plasma luminescence point P1. Furthermore, by arranging the head of the nozzle 7 as close to the plasma luminescence point P1 as possible, it becomes easy to make the droplet 17 ejected from the head of the nozzle 7 pass through the plasma luminescence point P1 accurately, and to control timing at which the droplet 17 passes through the plasma luminescence point P1. That is, according to this particular embodiment, it is possible to improve the passing position stability of the droplet 17 without reducing the energy (light intensity) of the EUV light Lb that is valid for exposure in the EUV exposure apparatus 21. As a result, it is possible to generate the EUV light Lb with stable intensity.

Moreover, it is preferable to locate at least a part or whole of the target collection cylinder 14 inside the obscuration region OB. In this arrangement, as with the nozzle 7, it is preferable that the target collection cylinder 14 is located as close to the plasma luminescence point P1 as possible while being outside the convergence region E2 (cf. FIG. 3). Thus, by arranging the target collection cylinder 14 outside the convergence region E2, it is possible to prevent the target collection cylinder 14 from being damaged by the charged particles from the plasma luminescence point P1. Furthermore, by arranging the target collection cylinder 14 as close to the plasma luminescence point P1 as possible, it is possible to shorten an interval between the head of the nozzle 7 and the target collection cylinder 14, and therefore, it is possible to have the target collection cylinder 14 steadily collect debris such as residual droplets not having contributed to generation of the EUV light Lb, and so forth, for instance. As a result, it is possible to generate the EUV light Lb with stable intensity. In addition, in this arrangement also, the energy (light intensity) of the EUV light Lb that is valid for exposure in the EUV exposure apparatus 21 will not be reduced.

In this particular embodiment, the case where the head of the nozzle 7 and the target collection cylinder 14 are located outside the convergence region E2 while being inside the obscuration region OB has been explained as an example. However, the present invention is not limited to this case. It is also possible that the head of the nozzle 7 and/or the target collection cylinder 14 are located as far from the magnetic field E2 as possible while being inside the obscuration region OB. Thereby, even if the charged particle flies out from the magnetic field region E1, it is possible to steadily prevent the head of the nozzle 7 and/or the target collection cylinder 14 from being damaged.

Moreover, in this particular embodiment, as can be seen in the drawing, the case where the droplet 17 is ejected from the nozzle 7 located on the upper side of the optical axis A1 (cf. FIG. 2, for instance) of the EUV light Lb toward the target collection cylinder 14 located on the lower side of the optical axis A1 while passing through the plasma luminescence point P1 has been explaining as an example. However, the present invention is not limited to this arrangement, while it is also possible that the droplet 17 is ejected from the nozzle 7 located on the lower side of the optical axis A1 of the EUV light Lb toward the target collection cylinder 14 located on the upper side of the optical axis A1 while passing through the plasma luminescence point P1.

Fifth Embodiment

Figure 18:
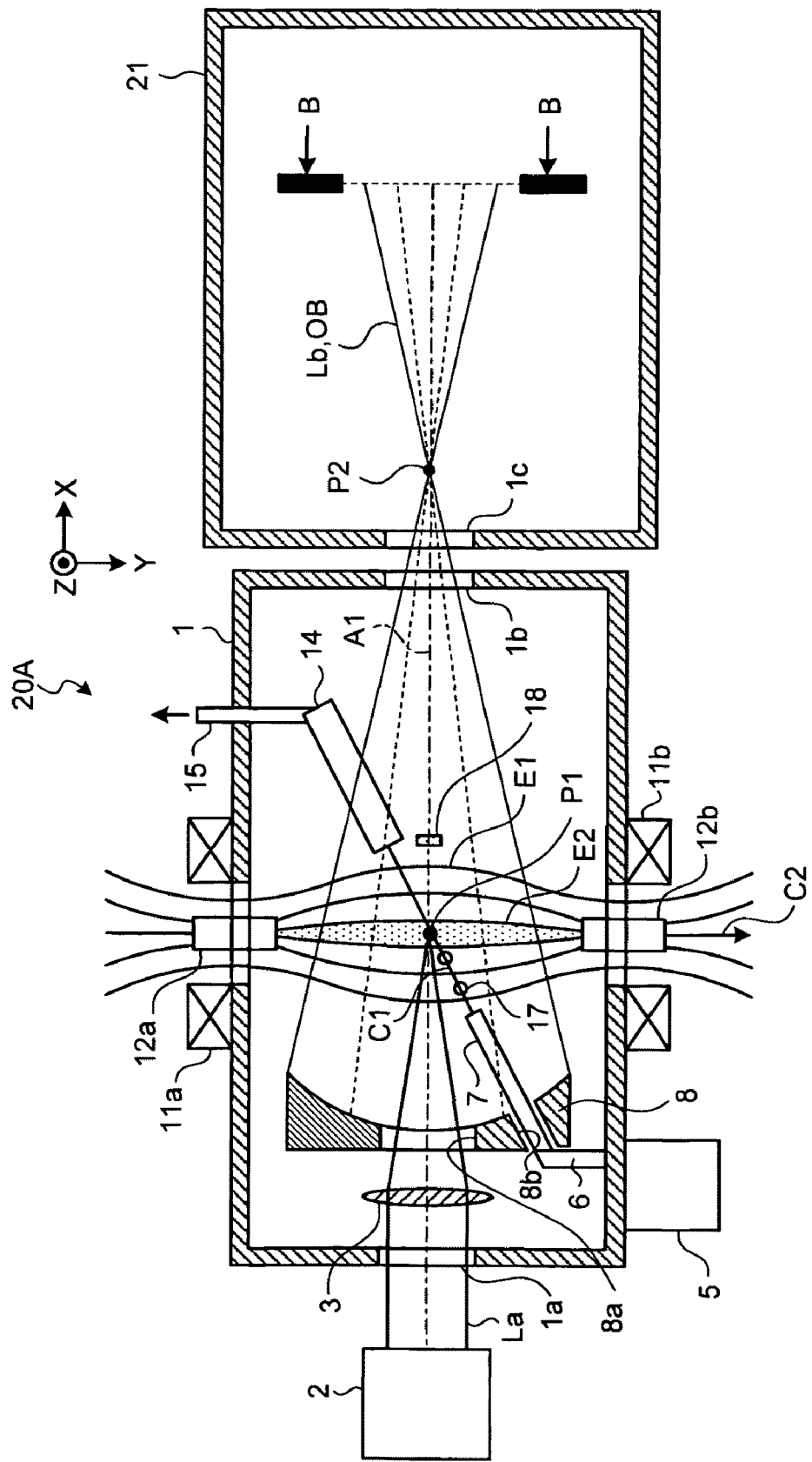
FIG. 18 is a vertical cross-sectional view of an extreme ultraviolet light source apparatus according to a fifth embodiment of the present invention when the extreme ultraviolet light source apparatus is cut at a face including an optical axis of an EUV light.
Figure 19:
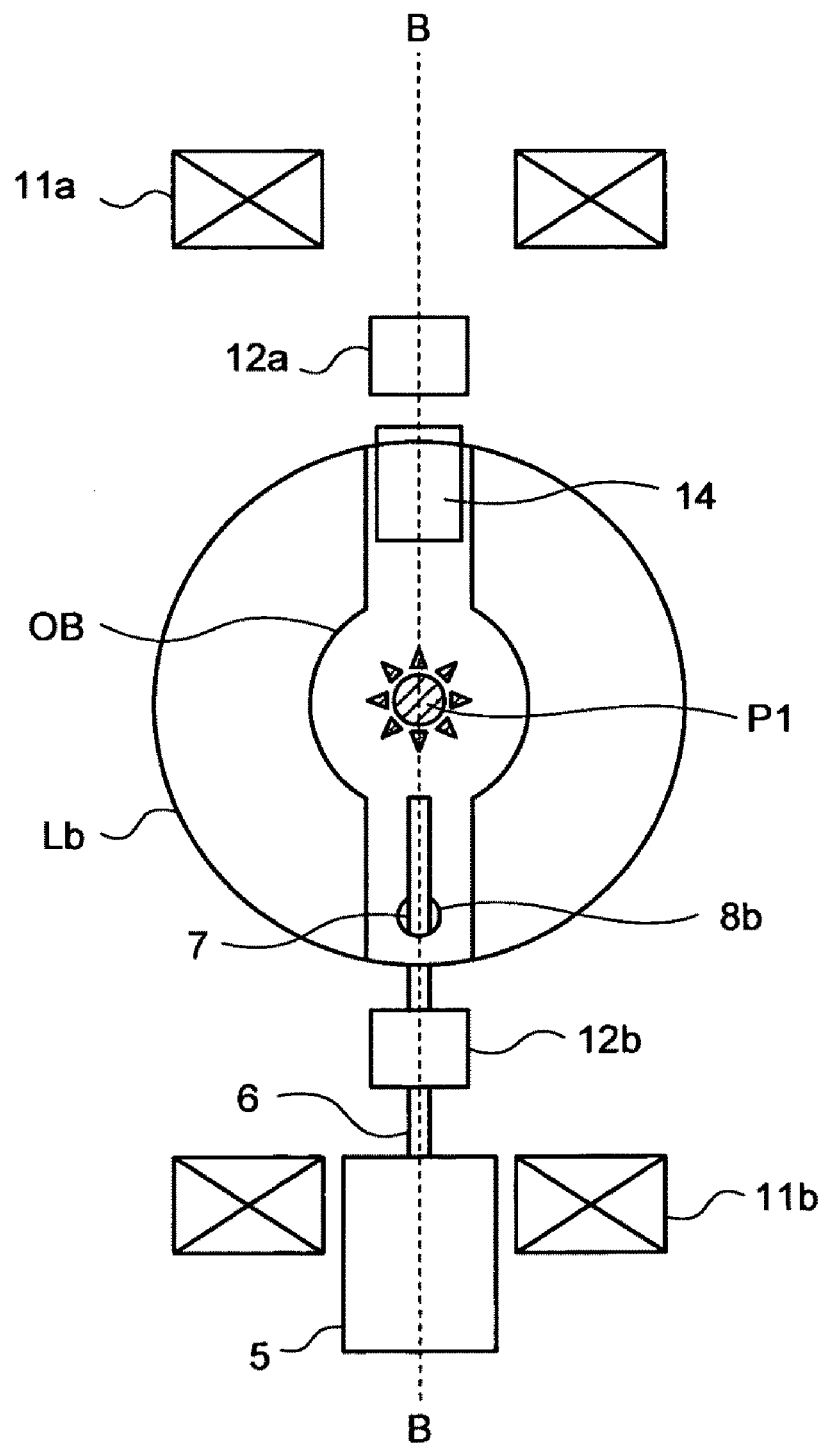
FIG. 19 is an illustration showing an example of a far field pattern transcribed on B-B surface in FIG. 18.

Next, a fifth embodiment of the present invention will be described in detail with reference to the accompanying drawings. FIG. 18 is a vertical cross-sectional view of an extreme ultraviolet light source apparatus according to the fifth embodiment of the present invention when the extreme ultraviolet light source apparatus is cut at a face including an optical axis of an EUV light. FIG. 19 is an illustration showing an example of a far field pattern transcribed on B-B surface in FIG. 18.

As shown in FIG. 18, an extreme ultraviolet light source apparatus 20A according to this particular embodiment has a structure similar to the extreme ultraviolet light source apparatus 20 according to the fourth embodiment. However, as shown in FIGS. 18 and 19, in the extreme ultraviolet light source apparatus 20A according to this particular embodiment, in the drawing, in the structure that the droplet 17 is ejected from the nozzle 7 located on the lower side of the optical axis A1 (cf. FIG. 2, for instance) of the EUV light Lb toward the target collection cylinder 14 located on the upper side of the optical axis A1 while passing through the plasma luminescence point P1, the nozzle 7 and/or the supply tube 6 are mounted inside a through hole 8b being formed in the EUV collector mirror 8, and at least the head of the nozzle 7 projects from the reflective surface of the EUV collector mirror 8 toward the plasma luminescence point P1.

One aperture of the through hole 8b is formed in a region corresponding to the obscuration region OB in the reflective surface of the EUV collector mirror 8. On the other hand, the other aperture of the through hole 8b is formed on a back side of the EUV collector mirror 8 (a surface opposite to the reflective surface). That is, the through hole 8b penetrates the EUV collector mirror 8 from the back side (the surface opposite to the reflective surface) to the reflective surface of the EUV collector mirror 8, for instance. However, it is not limited to such arrangement. A through hole penetrating the EUV collector mirror 8 from a side surface to the reflective surface of the EUV collector mirror 8, or a notch formed at a rim of the reflective surface of the EUV collector mirror 8 can also be applied.

Thus, by having the structure in that at least the head of the nozzle 7 projects from the region opposite to the obscuration region OB in the reflective surface of the EUV collector mirror 8, it is possible to achieve the same effects as in the fourth embodiment. Additionally, in this particular embodiment, because it is possible to arrange the EUV collector mirror 8 and the plasma luminescence point P1 closer to each other, it is possible to downsize the vacuum chamber 1 while it is possible to increase a reflection solid angle with respect to the EUV light Lb emitted from the plasma luminescence point P1, i.e. a reflectance percentage with respect to the emitted EUV light Lb. As a result, it is possible to make the extreme ultraviolet light source apparatus 20A high-power while downsizing the extreme ultraviolet light source apparatus 20A.

In addition, in this particular embodiment, as can be seen in the drawing, the case where the droplet 17 is ejected from the nozzle 7 located on the upper side of the optical axis A1 (cf. FIG. 2, for instance) of the EUV light Lb toward the target collection cylinder 14 located on the lower side of the optical axis A1 while passing through the plasma luminescence point P1 has been explained as an example. However, the present invention is not limited to this arrangement, it is also possible that the droplet 17 is ejected from the nozzle 7 located on the lower side of the optical axis A1 of the EUV light Lb toward the target collection cylinder 14 located on the upper side of the optical axis A1 while passing through the plasma luminescence point P1. In this arrangement, in place of the nozzle 7 and/or the supply tube 6, the target collection cylinder 14 and/or the drain tube 15 are mounted inside a through hole or a notch formed at the EUV collector mirror 8, while the target collection cylinder 14 projects from the reflective surface of the EUV collector mirror 8 toward the plasma luminescence point P1.

In the above-described first to fifth embodiments, charged particles are simply made to adhere to the charged particle collection (receiving) cylinders 12a and 12b. However, it is also possible to further vacuum up the charged particles being adhered to the charged particle collection (receiving) cylinders 12a and 12b via the drain tubes 13a and 13b.

Moreover, although neutral particles, and so forth, in the convergence region E2 are not ionized, it is possible to arrange an ionization means such as an x-irradiator, an electron-irradiator, an ultraviolet irradiator, a microwave irradiator, an EUV light irradiator, or the like, in order to ionize such neutral particles, etc. By this arrangement, it is possible to facilitate trapping of debris such as neutral particles, or the like.

According to each embodiment described above, because the nozzle is located outside the convergence region in which charged particles are converged in the magnetic field by Lorentz force while being inside the chamber provided for generating the extreme ultraviolet light, it is possible to perform collection of debris and a resumption of residual targets of which debris diffusion by the magnetical trap has been prevented in closely place. As a result, it is possible to perform the collection of debris and collection of residual targets using a simple structure.

In addition, the above-mentioned embodiments and the alternate examples can be arbitrarily combined with one another.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept of the invention as defined by the appended claims and their equivalents.

What is claimed is:

1. An extreme ultraviolet light source apparatus generating an extreme ultraviolet light from plasma generated by irradiating a target with a laser light, the extreme ultraviolet light source apparatus comprising:
    a magnetic field generator which generates a magnetic field region around a direction of the magnetic field passing through a plasma region in which the plasma is to be generated and converges charged particles including ion emitted from the plasma region toward the direction of the magnetic field;
    a first charged particle collector (receiver) mounted at both sides of an axis of the magnetic field in the magnetic field region in order to collect (receive) the charged particles converged by the magnetic field;
    a target supply unit supplying a target from a nozzle located outside a converging region in which the charged particles are to be converged inside the magnetic field region in an extreme ultraviolet light generating chamber; and
    a target collector located at a position opposite to the nozzle, the target collector collecting a residual target which does not contribute to generation of the plasma.

2. The extreme ultraviolet light source apparatus according to claim 1, wherein
    The target collector and the first charged particle collector (receiver) located at the side of the target collector are a single collection portion.

3. The extreme ultraviolet light source apparatus according to claim 1, wherein
    the axis of the magnetic field and an axis of supplying the target are tilted to make and angle between each other, and
    a tilt angle between the axis of the magnetic field and the axis of supplying the target is equal to or less than a maximum tilt angle allowing irradiation of the target with the laser light with respect to movement of the target as occurred by a Lorentz force received while the target passes through the magnetic field.

4. The extreme ultraviolet light source apparatus according to claim 1, wherein
    at least the nozzle head is located within an obscuration region of the EUV light emitted from the plasma.

5. The extreme ultraviolet light source apparatus according to claim 1, wherein
    at least a part of the target collector is located within an obscuration region of the EUV light emitted from the plasma.

6. The extreme ultraviolet light source apparatus according to claim 1, wherein
    at least one or both of the target collector and the first charged particle collector (receiver) comprises:
        a liquescence portion liquidizing a collected (received) material; and
        a drain portion ejecting the material liquidized by the liquescence portion.

7. The extreme ultraviolet light source apparatus according to claim 1, wherein
    the nozzle includes an electrical field generator generating an electrical field in a nozzle head region, and
    a track of the charged particle is drifted from the nozzle head by the electrical field generated around the nozzle head region.

8. The extreme ultraviolet light source apparatus according to claim 7, wherein
    the electrical field generator includes an electrostatic grid covering the nozzle head region except an aperture for supplying the target.

9. The extreme ultraviolet light source apparatus according to claim 7, further comprising:
    a second charged particle collector (receiver) collecting charged particles of which track is drifted by the electrical field generator.

10. The extreme ultraviolet light source apparatus according to claim 9, wherein
    the second charged particle collector (receiver) comprises:
        a liquescence portion liquidizing a collected (received) material, and
        a drain portion ejecting the material liquidized by the liquescence portion.

11. The extreme ultraviolet light source apparatus according to claim 7, wherein
    at least the nozzle head is located inside an obscuration region of the EUV light emitted from the plasma.

12. The extreme ultraviolet light source apparatus according to claim 7, wherein
    at least a part of the target collector is located within an obscuration region of the EUV light emitted from the plasma.

* * * * *